US010182502B2

(12) United States Patent
Boren

(10) Patent No.: US 10,182,502 B2
(45) Date of Patent: Jan. 15, 2019

(54) MESSAGE CABINET

(71) Applicant: Tommy Boren, Torrance, CA (US)

(72) Inventor: Tommy Boren, Torrance, CA (US)

( * ) Notice: Subject to any disclaimer, the term of this patent is extended or adjusted under 35 U.S.C. 154(b) by 0 days.

(21) Appl. No.: 15/832,732

(22) Filed: Dec. 5, 2017

(65) Prior Publication Data

US 2018/0160555 A1 Jun. 7, 2018

Related U.S. Application Data

(60) Provisional application No. 62/429,966, filed on Dec. 5, 2016.

(51) Int. Cl.

| | |
|---|---|
| ***H05K 5/00*** | (2006.01) |
| ***H05K 5/02*** | (2006.01) |
| ***G09F 9/302*** | (2006.01) |

(52) U.S. Cl.

CPC ......... *H05K 5/0017* (2013.01); *G09F 9/3023* (2013.01); *H05K 5/0213* (2013.01)

(58) Field of Classification Search

CPC .. H05K 5/0213; H05K 7/20145; G09F 13/00; G09F 13/22; G09F 2013/222; G09F 7/002; G09F 7/18; G09F 7/20; G09F 2007/1817; G09F 2007/1843; E04H 13/003

USPC ............ 361/690–698; 165/287; 349/58, 161; 40/124.5, 607.01, 773, 765, 772, 780; 706/213; 116/63

See application file for complete search history.

(56) References Cited

U.S. PATENT DOCUMENTS

| | | | | | |
|---|---|---|---|---|---|
| 3,952,437 | A * | 4/1976 | Mitchell | G09F 1/12 | 40/720 |
| 4,771,560 | A * | 9/1988 | Richards | G09F 7/002 | 40/606.18 |
| 5,471,775 | A * | 12/1995 | Hoyt | G09F 7/20 | 40/601 |
| 2004/0070702 | A1 * | 4/2004 | Meyer | G09F 9/30 | 349/73 |
| 2008/0158468 | A1 * | 7/2008 | Kim | G02F 1/13336 | 349/58 |
| 2010/0045892 | A1 * | 2/2010 | Hu | G02F 1/133308 | 349/58 |
| 2011/0037937 | A1 * | 2/2011 | Yang | G02F 1/133385 | 349/161 |
| 2012/0255721 | A1 * | 10/2012 | Kim | G02F 1/133382 | 165/288 |
| 2014/0259634 | A1 * | 9/2014 | Cox | G09F 27/008 | 29/592.1 |

(Continued)

*Primary Examiner* — Dion Ferguson
*Assistant Examiner* — Amir A Jalali

(57) ABSTRACT

A message cabinet that is designed to reduce installation cost, improve energy savings, lower maintenance cost, be easier to service, and have a stronger construction for high winds. The message cabinet includes a main body, a pole-receiving hole, a first recess, a second recess, a first plurality of displays, and a second plurality of displays. The main body houses the electronic components of the present invention. The first plurality of displays and the second plurality of display allows the present invention to display electronic messages to drivers. The pole-receiving hole allows the present invention to be receive a mounting pole. The first recess and the second recess allow the present invention to dissipate heat accumulated by the electronic components within the main body.

20 Claims, 6 Drawing Sheets

(56) References Cited

U.S. PATENT DOCUMENTS

| | | | | |
|---|---|---|---|---|
| 2015/0250067 | A1* | 9/2015 | Gaddam | H05K 5/0213 40/541 |
| 2015/0269877 | A1* | 9/2015 | Williams | G09F 15/0087 40/541 |
| 2016/0078790 | A1* | 3/2016 | Truijen | G09F 7/20 40/607.1 |
| 2017/0092162 | A1* | 3/2017 | Skarvellis | G09F 7/18 |

* cited by examiner

MESSAGE CABINET

The current application claims a priority to the U.S. Provisional Patent application Ser. No. 62/429,966 filed on Dec. 2, 2016.

FIELD OF THE INVENTION

The present invention relates generally to a message cabinet. More specifically, the present invention is a message cabinet that is designed to reduce installation cost, improve energy savings, lower maintenance cost, be easier to service, and have a stronger construction for high winds.

BACKGROUND OF THE INVENTION

Message cabinets have been giving drivers updates for years, aiding them in their commutes and helping them avoid accidents. The typical message cabinet includes two housings for the electronic message centers with each housing further including a mounting bracket for each housing to be mounted to a pole. Due to the requirement of mounting brackets, shrouds are additionally required to hide these mounting brackets. Each of the housings only include ventilation on the bottom to dissipate heat accumulated by the electronic components within the housings. Furthermore, the typical message cabinet includes two graphics processing units, two controller units, and two wireless systems for each of the housings. Due to the requirement of the two graphics processing units, two controller units, and two wireless systems, there is more risk for failure. As technology has advanced, there are now better ways to design these message cabinets.

It is therefore an objective of the present invention to provide a message cabinet that is designed to reduce installation cost, improve energy savings, lower maintenance cost, be easier to service, and have a stronger construction for high winds. The present invention is a single double-faced housing which includes a pole opening and mounting plates for the present invention to be mounted to a pole rather than using mounting brackets. This eliminates the need for shrouds to hide mounting brackets. The present invention includes ventilation at the sides rather than just the bottom to more efficiently dissipate heat accumulated by the electronic components. Furthermore, the present invention includes one graphics processing unit, one controller unit, and one wireless system to minimize the risk for failure.

DETAIL DESCRIPTIONS OF THE INVENTION

Figure 1:
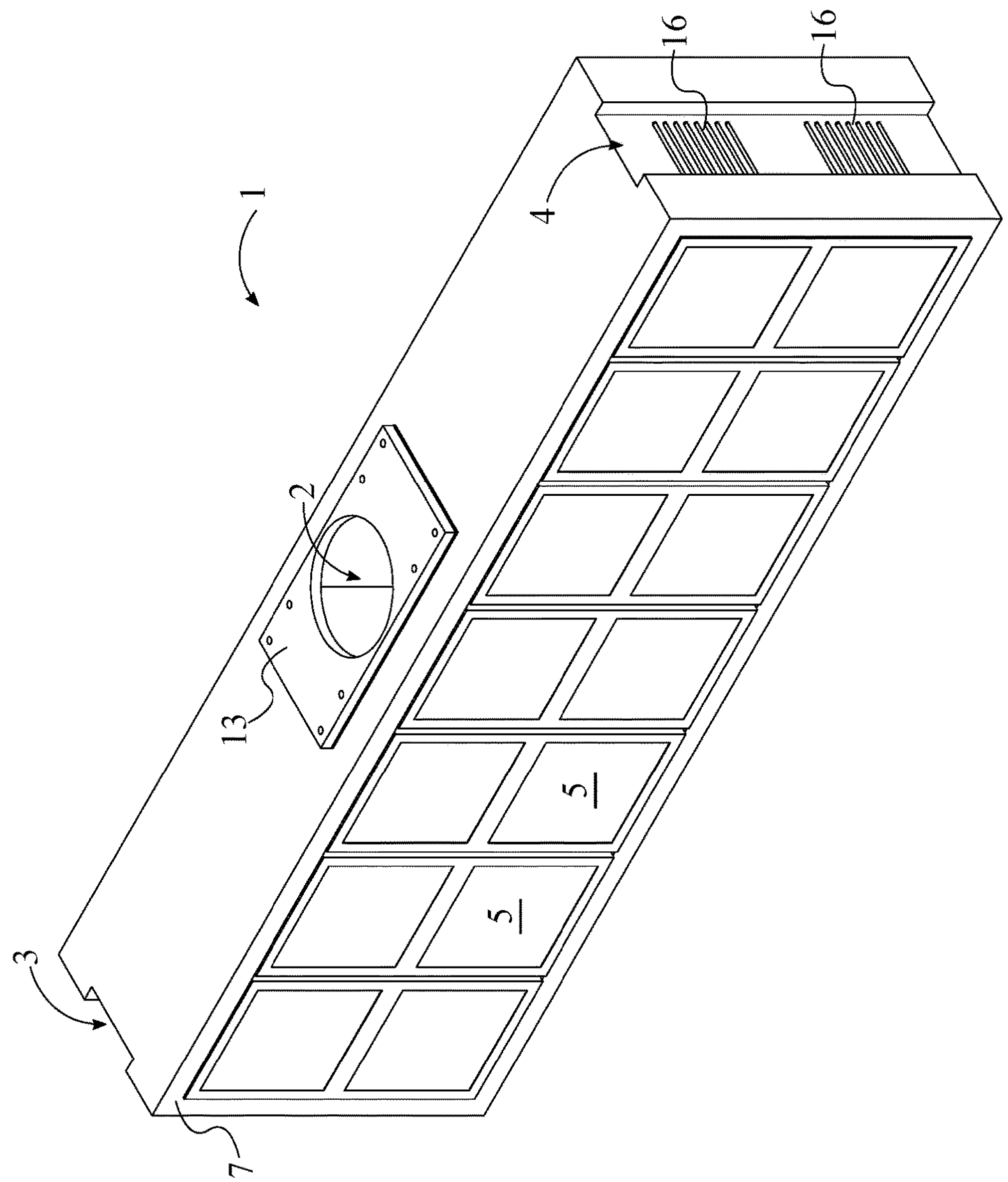
FIG. 1 is a front-right perspective view of the present invention.

All illustrations of the drawings are for the purpose of describing selected versions of the present invention and are not intended to limit the scope of the present invention.

In reference to FIGS. 1 through 6, the present invention is a message cabinet that is designed to reduce installation cost, improve energy savings, lower maintenance cost, is easier to service, and has a stronger construction for high winds. The present invention incorporates a front serviceable module design for easy maintenance. The present invention comprises a main body 1, a pole-receiving hole 2, a first recess 3, a second recess 4, a first plurality of displays 5, and a second plurality of displays 6. The main body 1 houses the electronic components of the present invention. In the preferred embodiment of the present invention, the main body 1 may be composed of high strength 6063 T-6 aluminum, anodized black material. The main body 1 comprises a first face 7 and a second face 8, which are positioned opposite to each other. The first face 7 provides a mounting face for the first plurality of displays 5. Similarly, the second face 8 provides a mounting face for the second plurality of displays 6. The pole-receiving hole 2 allows a mounting pole to be traversed through the main body 1. The first recess 3 and the second recess 4 provide ventilation areas for the present invention. The first plurality of displays 5 and the second plurality of displays 6 allow the present invention to display electronic messages to update and aid drivers.

Figure 2:
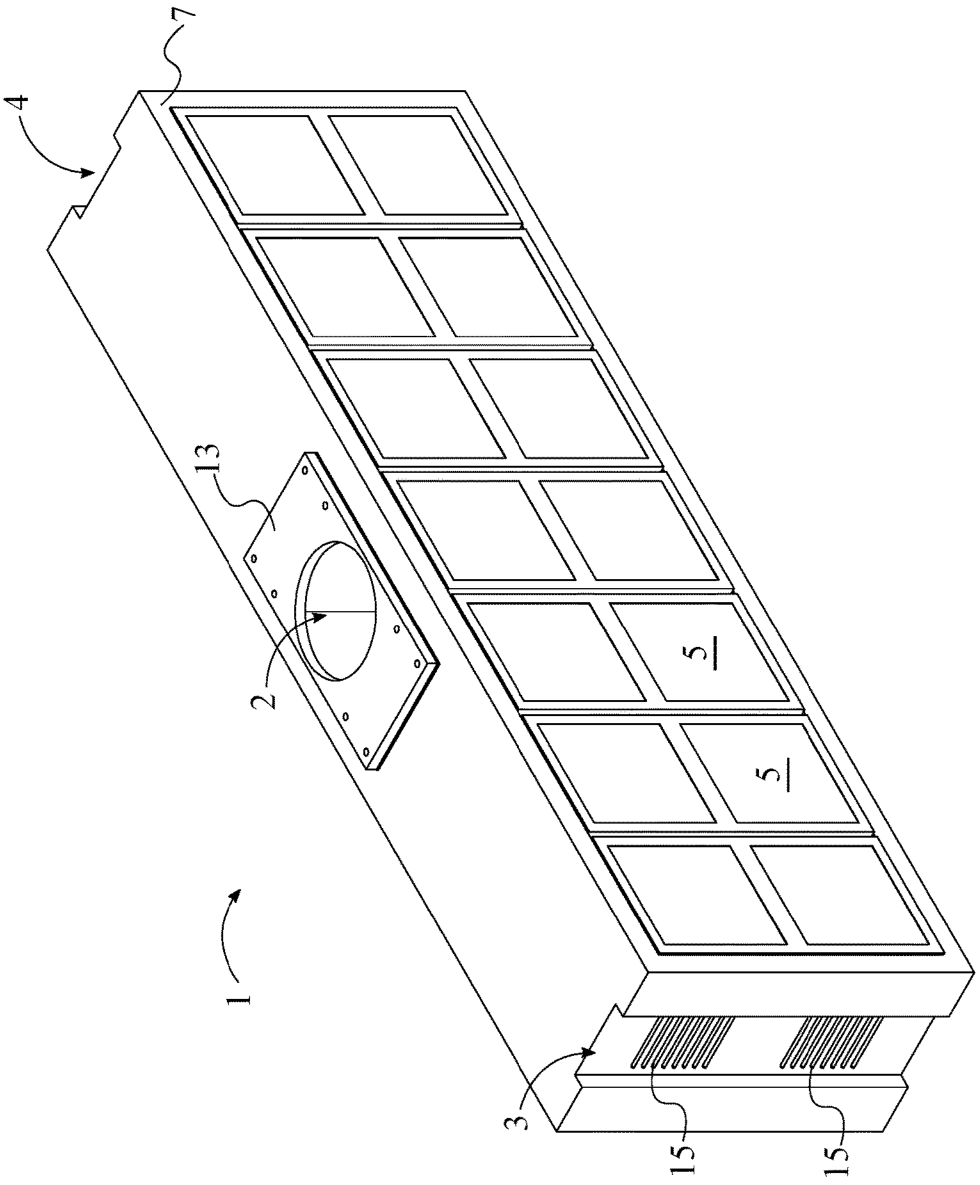
FIG. 2 is a front-left perspective view of the present invention.
Figure 3:
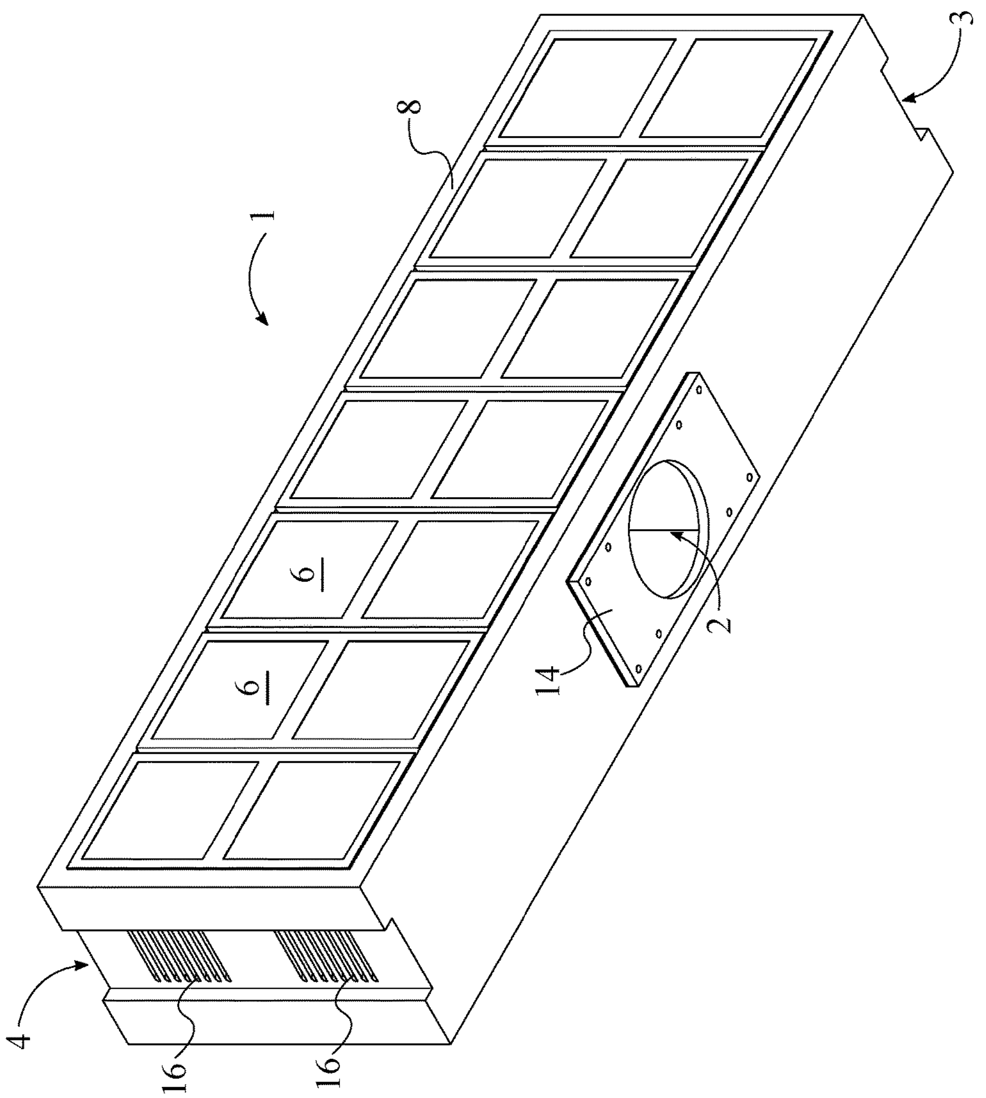
FIG. 3 is a rear-bottom perspective view of the present invention.

The general configuration of the aforementioned components allows the present invention to reduce installation cost, improve energy savings, lower maintenance cost, be easier to service, and have a stronger construction for high winds. With reference to FIGS. 1 and 2, the first plurality of displays 5 is distributed across the first face 7 and mounted onto the first face 7. The second plurality of displays 6 is distributed across the second face 8 and the mounted onto the second face 8. The arrangement between the main body 1, the first plurality of displays 5, and the second plurality of displays 6 allows the present invention to display electronic messages to drivers driving in either direction. The first recess 3 and the second recess 4 traverse into the main body 1 in between the first face 7 and the second face 8. The first recess 3 and the second recess 4 are positioned opposite to each other across the main body 1. The arrangement between the main body 1, the first recess 3, and the second recess 4 provides areas of ventilation for the present invention to dissipate heat. The pole-receiving hole 2 traverses through the main body 1 in between the first face 7 and the second face 8. The pole-receiving hole 2 is also positioned in between the first recess 3 and the second recess 4. The arrangement of the pole-receiving hole 2 allows the present invention to receive a mounting pole, where the main body 1 is symmetrically oriented with the mounting pole. In the preferred embodiment of the present invention, the first plurality of displays 5 is arranged in a grid configuration on the first face 7. Similarly, the second plurality of displays 6 is arranged in a grid configuration on the second face 8.

Figure 5:
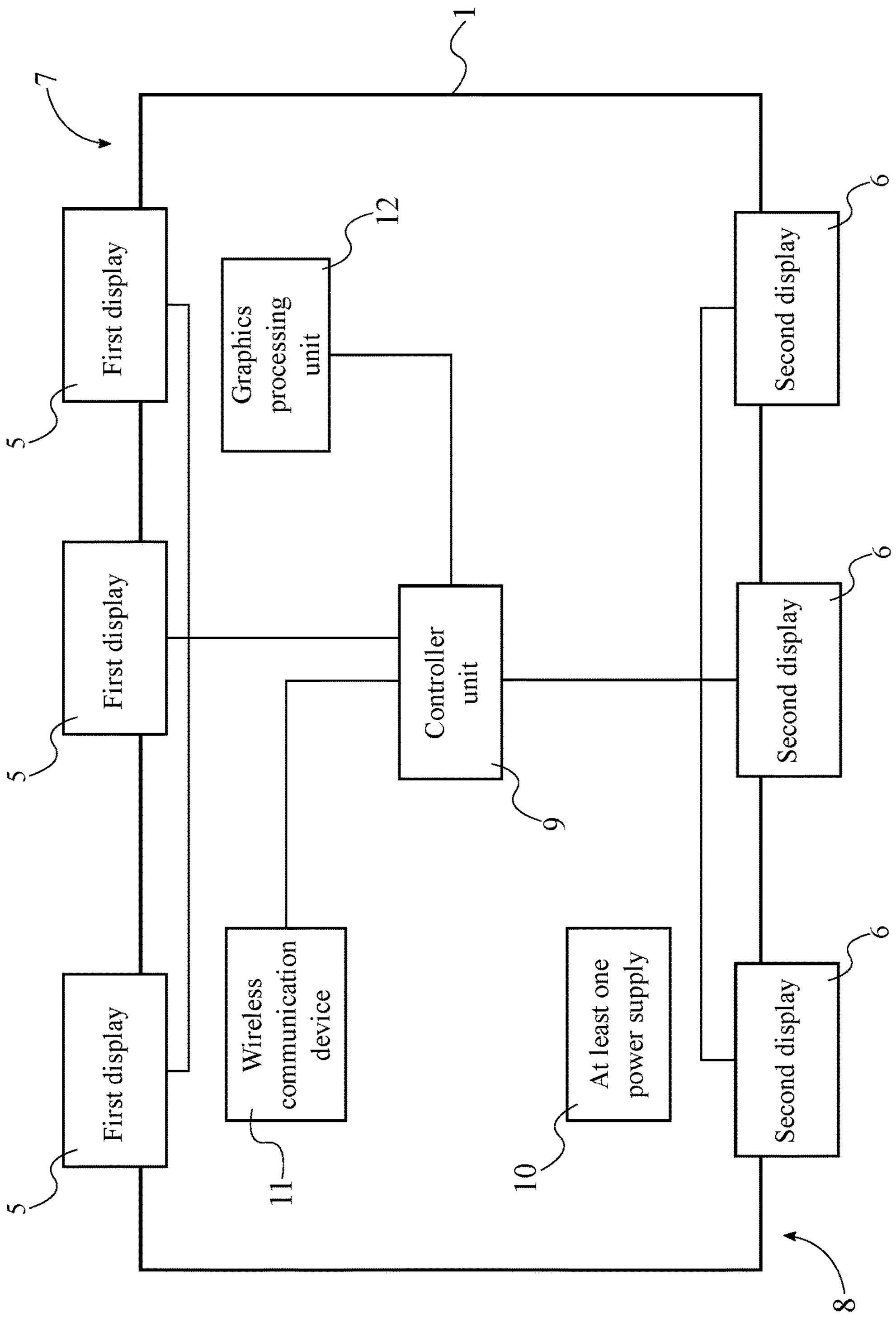
FIG. 5 is a schematic diagram displaying the electronic connections of the present invention.

With reference to FIG. 5, The present invention may further comprise a controller unit 9, at least one power supply 10, a wireless communication device 11, and a graphics processing unit 12. The controller unit 9 is used to manage and control the different functionalities for each of the first plurality of displays 5, each of the second plurality of displays 6, the wireless communication device 11, and the graphics processing unit 12. The at least one power supply 10 provides electrical power to the first plurality of displays 5, the second plurality of displays 6, the controller unit 9, the wireless communication device 11, and the graphics processing unit 12. The wireless communication device 11 allows the present invention to wireless communicate with another external electronic device. The graphics processing unit 12 communicates with the first plurality of displays 5 and the second plurality of displays 6 for the creation of images, particularly being electronic messages for drivers.

Figure 6:
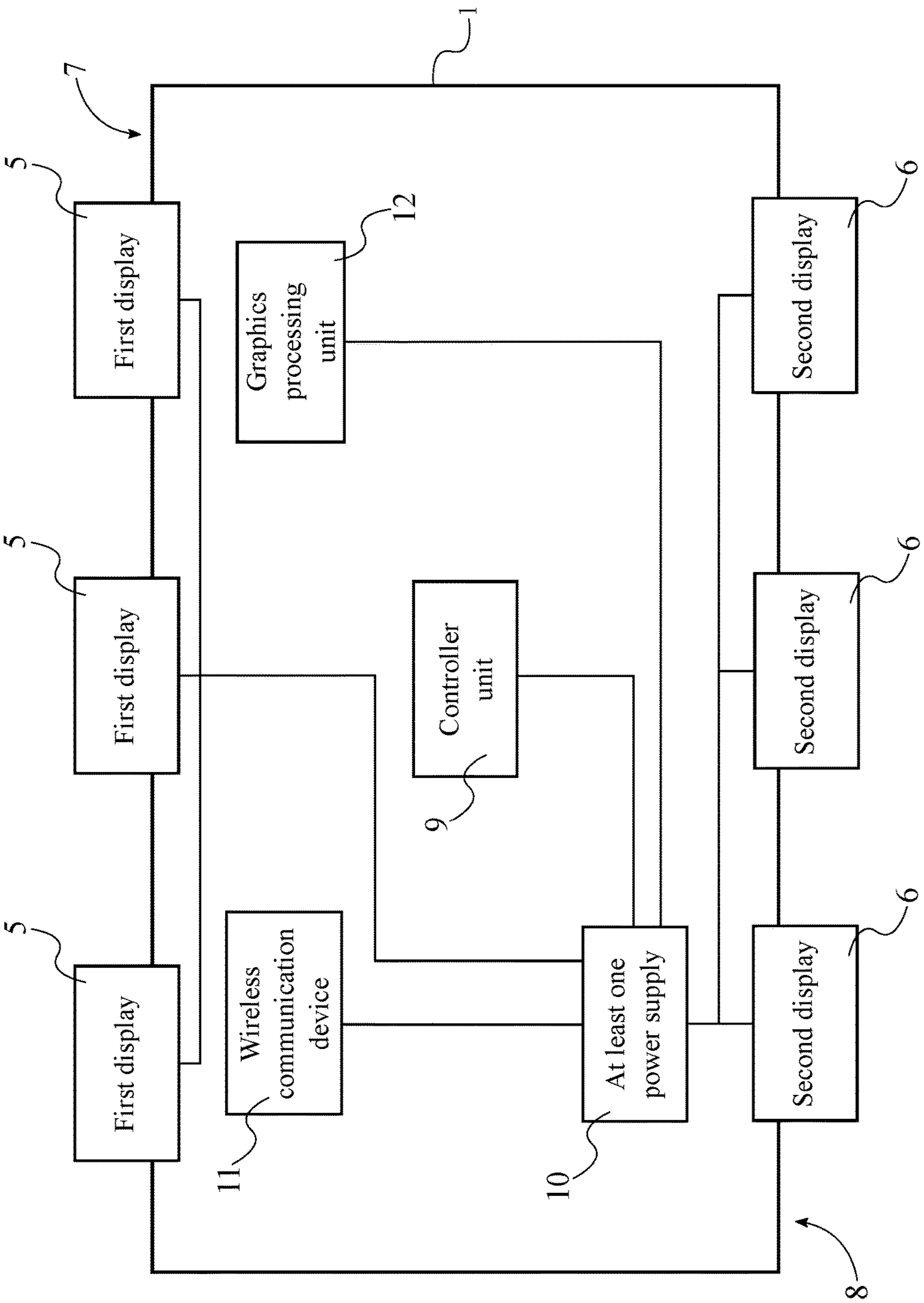
FIG. 6 is a schematic diagram displaying the electrical connections of the present invention.

The controller unit 9, the at least one power supply 10, the wireless communication device 11, and the graphics processing unit 12 are mounted within the main body 1 to protect them from the environment surrounding the present invention. The controller unit 9 is electronically connected to the wireless communication device 11, the graphics processing unit 12, each of the first plurality of displays 5, and each of the second plurality of displays 6 allowing the controller unit 9 to communicate with the wireless communication device 11, the graphics processing unit 12, each of the first plurality of displays 5, and each of the second plurality of displays 6. With reference to FIG. 6, the at least one power supply 10 is electrically connected to the controller unit 9, the wireless communication device 11, the graphics processing unit 12, each of the first plurality of displays 5, and each of the second plurality of displays 6 allowing the at least one power supply 10 to provide power to the wireless communication device 11, the graphics processing unit 12, each of the first plurality of displays 5, and each of the second plurality of displays 6. The controller unit 9, the at least one power supply 10, the wirelessly communication device 11, and the graphics processing unit 12 are hermetically sealed from the pole-receiving hole 2 providing protection for the controller unit 9, the at least one power supply 10, the wireless communication device 11, and the graphics processing unit 12 from weather conditions such as rain. In the preferred embodiment of the present invention, the present invention only comprises a single controller unit 9, a single graphics processing unit 12, and a single wireless communication device 11 to minimize the risk of failure, for easy maintenance of the present invention and to require less electrical power.

Figure 4:
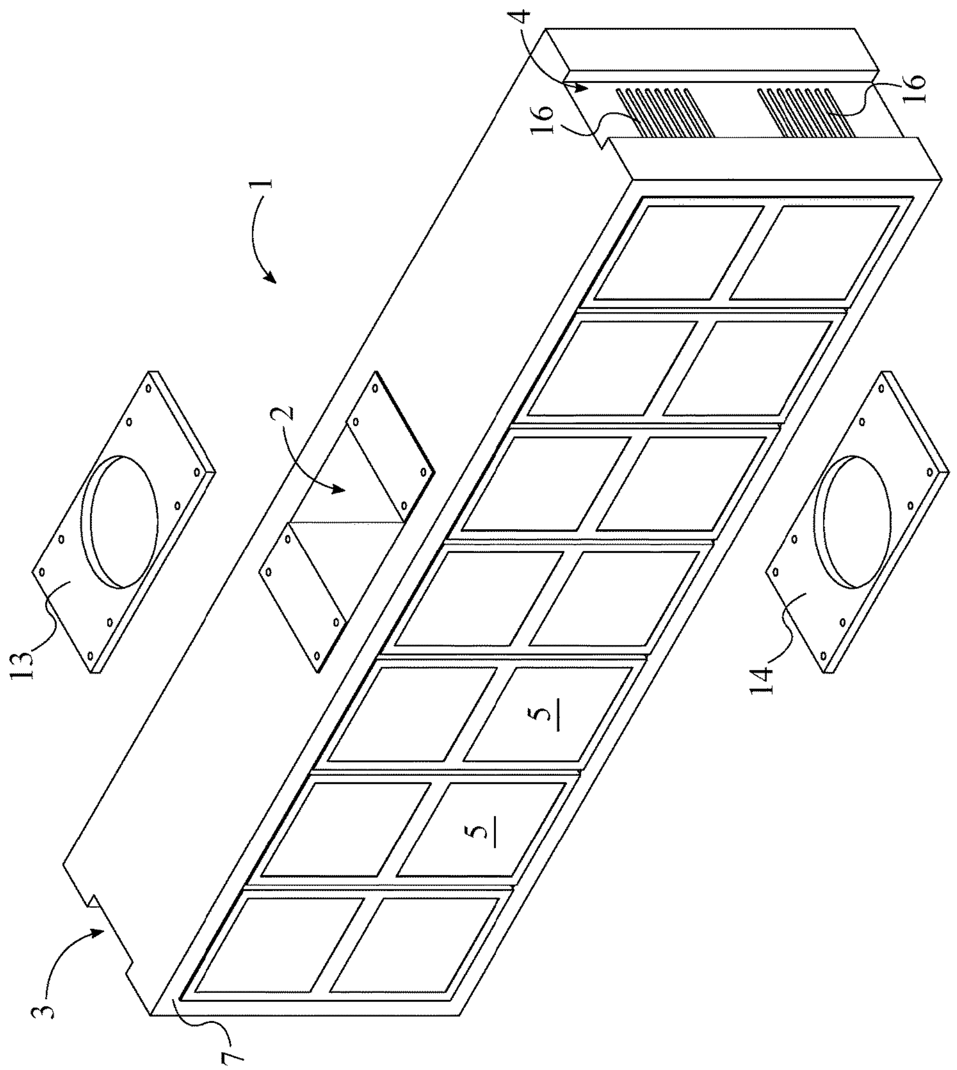
FIG. 4 is an exploded perspective view of the present invention.

With reference to FIG. 4, the present invention may further comprise a first mounting plate 13 and a second mounting plate 14. The first mounting plate 13 and the second mounting plate 14 allow the present invention to be securely mounted to a pole. The first mounting plate 13 and the second mounting plate 14 are positioned concentric with the pole-receiving hole 2. The first mounting plate 13 and the second mounting plate 14 are positioned adjacent to the main body 1. The first mounting plate 13 and the second mounting plate 14 are positioned opposite to each other across the main body 1. The arrangement between the first mounting plate 13, the second mounting plate 14, and the main body 1 allows the first mounting plate 13 and the second mounting plate 14 to prevent the main body 1 from moving about or along a mounting pole.

With reference to FIGS. 1 and 2, the present invention may further comprise a first plurality of louvers 15 and a second plurality of louvers 16. The first plurality of louvers 15 and the second plurality of louvers 16 allow the present invention to dissipate heat accumulated by the controller unit 9, the wireless communication device 11, the graphics processing unit 12, and the at least one power supply 10. The first plurality of louvers 15 and the second plurality of louvers 16 additionally provides these openings in the main body 1 to dissipate heat without allowing precipitation or other environmental factors from excessively entering the main body 1. The first plurality of louvers 15 is integrated into and distributed along the first recess 3. The second plurality of louvers 16 is integrated into and distributed along the second recess 4. The arrangement between the first recess 3 and the first plurality of louvers 15 allows the present invention to be well ventilated through the first recess 3. The arrangement between the second recess 4 and the second plurality of louvers 16 allows the present invention to be well ventilated through the second recess 4.

The method of installing the present invention requires positioning the present invention concentric with a mounting pole of a new or existing sign. The mounting pole is traversed through the first mounting plate 13. The first mounting plate 13 is then welded to the mounting pole. Next, the mounting pole is traversed through the main body 1 via the pole-receiving hole 2 and the main body 1 is mounted to the first mounting plate 13 through the use of fasteners. Then, the mounting pole is traversed through the second mounting plate 14. The second mounting plate 14 is mounted to the main body 1 through the use of fasteners and lastly, the second mounting plate 14 is welded to the mounting pole thereby securing the present invention in a desired position along the mounting pole. This method of installation of the present invention is more cost-efficient compared to the installation of conventional message cabinets.

Although the invention has been explained in relation to its preferred embodiment, it is to be understood that many other possible modifications and variations can be made without departing from the spirit and scope of the invention as hereinafter claimed.

What is claimed is:

1. A message cabinet comprises:

a main body;

a pole-receiving hole;

a first recess;

a second recess;

a first plurality of displays;

a second plurality of displays;

the main body comprises a first face and a second face;

the first face and the second face being positioned opposite to each other about the main body;

the first plurality of displays being distributed across the first face;

the first plurality of displays being mounted onto the first face;

the second plurality of displays being distributed across the second face;

the second plurality of displays being mounted onto the second face;

the first recess and the second recess traversing into the main body in between the first face and the second face;

the first recess and the second recess being positioned opposite to each other about the main body;

the pole-receiving hole traversing through the main body in between the first face and the second face; and the pole-receiving hole being positioned in between the first recess and the second recess.

2. The message cabinet as claimed in claim 1 comprises:

a controller unit;

at least one power supply;

a wireless communication device;

a graphics processing unit;

the controller unit, the at least one power supply, the wireless communication device, and the graphics processing unit being mounted within the main body;

the controller unit being electronically connected to the wireless communication device, the graphics processing unit, each of the first plurality of displays, and each of the second plurality of displays; and the at least one power supply being electrically connected to the controller unit, the wireless communication unit, the graphics processing unit, each of the first plurality of displays, and each of the second plurality of displays.

3. The message cabinet as claimed in claim 2 comprises:
the controller unit, the at least one power supply, the wireless communication device, and the graphics processing unit being hermetically sealed from the pole-receiving hole.

4. The message cabinet as claimed in claim 1 comprises:
a first mounting plate;
a second mounting plate;
the first mounting plate and the second mounting plate being positioned concentric with the pole-receiving hole;
the first mounting plate and the second mounting plate being positioned adjacent to the main body; and
the first mounting plate and the second mounting plate being positioned opposite to each other across the main body.

5. The message cabinet as claimed in claim 1 comprises:
a first plurality of louvers;
the first plurality of louvers being distributed along the first recess; and
the first plurality of louvers being integrated into the first recess.

6. The message cabinet as claimed in claim 1 comprises:
a second plurality of louvers;
the second plurality of louvers being distributed along the second recess; and
the second plurality of louvers being integrated into the second recess.

7. The message cabinet as claimed in claim 1 comprises:
the first plurality of displays being arranged into a grid configuration on the first face.

8. The message cabinet as claimed in claim 1 comprises:
the second plurality of displays being arranged into a grid configuration on the second face.

9. A message cabinet comprises:
a main body;
a pole-receiving hole;
a first recess;
a second recess;
a first plurality of displays;
a second plurality of displays;
a first plurality of louvers;
a second plurality of louvers;
the main body comprises a first face and a second face;
the first face and the second face being positioned opposite to each other about the main body;
the first plurality of displays being distributed across the first face;
the first plurality of displays being mounted onto the first face;
the second plurality of displays being distributed across the second face;
the second plurality of displays being mounted onto the second face;
the first recess and the second recess traversing into the main body in between the first face and the second face;
the first recess and the second recess being positioned opposite to each other about the main body;
the pole-receiving hole traversing through the main body in between the first face and the second face;
the pole-receiving hole being positioned in between the first recess and the second recess;
the first plurality of louvers being distributed along the first recess;
the first plurality of louvers being integrated into the first recess;
the second plurality of louvers being distributed along the second recess; and
the second plurality of louvers being integrated into the second recess.

10. The message cabinet as claimed in claim 9 comprises:
a controller unit;
at least one power supply;
a wireless communication device;
a graphics processing unit;
the controller unit, the at least one power supply, the wireless communication device, and the graphics processing unit being mounted within the main body;
the controller unit being electronically connected to the wireless communication device, the graphics processing unit, each of the first plurality of displays, and each of the second plurality of displays; and
the at least one power supply being electrically connected to the controller unit, the wireless communication unit, the graphics processing unit, each of the first plurality of displays, and each of the second plurality of displays.

11. The message cabinet as claimed in claim 10 comprises:
the controller unit, the at least one power supply, the wireless communication device, and the graphics processing unit being hermetically sealed from the pole-receiving hole.

12. The message cabinet as claimed in claim 9 comprises:
a first mounting plate;
a second mounting plate;
the first mounting plate and the second mounting plate being positioned concentric with the pole-receiving hole;
the first mounting plate and the second mounting plate being positioned adjacent to the main body; and
the first mounting plate and the second mounting plate being positioned opposite to each other across the main body.

13. The message cabinet as claimed in claim 9 comprises:
the first plurality of displays being arranged into a grid configuration on the first face.

14. The message cabinet as claimed in claim 9 comprises:
the second plurality of displays being arranged into a grid configuration on the second face.

15. A message cabinet comprises:
a main body;
a pole-receiving hole;
a first recess;
a second recess;
a first plurality of displays;
a second plurality of displays;
a first mounting plate;
a second mounting plate;
the main body comprises a first face and a second face;
the first face and the second face being positioned opposite to each other about the main body;
the first plurality of displays being distributed across the first face;
the first plurality of displays being mounted onto the first face;
the second plurality of displays being distributed across the second face;
the second plurality of displays being mounted onto the second face;

the first recess and the second recess traversing into the main body in between the first face and the second face;

the first recess and the second recess being positioned opposite to each other about the main body;

the pole-receiving hole traversing through the main body in between the first face and the second face;

the pole-receiving hole being positioned in between the first recess and the second recess;

the first mounting plate and the second mounting plate being positioned concentric with the pole-receiving hole;

the first mounting plate and the second mounting plate being positioned adjacent to the main body; and the first mounting plate and the second mounting plate being positioned opposite to each other across the main body.

16. The message cabinet as claimed in claim 15 comprises:

a controller unit;

at least one power supply;

a wireless communication device;

a graphics processing unit;

the controller unit, the at least one power supply, the wireless communication device, and the graphics processing unit being mounted within the main body;

the controller unit being electronically connected to the wireless communication device, the graphics processing unit, each of the first plurality of displays, and each of the second plurality of displays; and the at least one power supply being electrically connected to the controller unit, the wireless communication unit, the graphics processing unit, each of the first plurality of displays, and each of the second plurality of displays.

17. The message cabinet as claimed in claim 16 comprises:

the controller unit, the at least one power supply, the wireless communication device, and the graphics processing unit being hermetically sealed from the pole-receiving hole.

18. The message cabinet as claimed in claim 15 comprises:

a first plurality of louvers;

a second plurality of louvers;

the first plurality of louvers being distributed along the first recess;

the first plurality of louvers being integrated into the first recess;

the second plurality of louvers being distributed along the second recess; and the second plurality of louvers being integrated into the second recess.

19. The message cabinet as claimed in claim 15 comprises:

the first plurality of displays being arranged into a grid configuration on the first face.

20. The message cabinet as claimed in claim 15 comprises:

the second plurality of displays being arranged into a grid configuration on the second face.

* * * * *